United States Patent
Cho et al.

(10) Patent No.: US 7,339,392 B2
(45) Date of Patent: Mar. 4, 2008

(54) APPARATUS MEASURING SUBSTRATE LEAKAGE CURRENT AND SURFACE VOLTAGE AND RELATED METHOD

(75) Inventors: Sung-chan Cho, Anyang-si (KR); Suk-woo Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 11/342,530

(22) Filed: Jan. 31, 2006

(65) Prior Publication Data

US 2007/0018674 A1    Jan. 25, 2007

(30) Foreign Application Priority Data

Jul. 20, 2005    (KR) ...................... 10-2005-0065999

(51) Int. Cl.
    *G01R 31/26*    (2006.01)
(52) U.S. Cl. ........................ 324/765; 324/750; 324/753
(58) Field of Classification Search .................... None
    See application file for complete search history.

(56) References Cited

U.S. PATENT DOCUMENTS

| | | | |
|---|---|---|---|
| 4,812,756 A * | 3/1989 | Curtis et al. ................. | 324/750 |
| 5,485,091 A | 1/1996 | Verkuil | |
| 6,522,158 B1 * | 2/2003 | Fung et al. ................. | 324/765 |
| 6,597,193 B2 | 7/2003 | Lagowski et al. | |
| 7,064,565 B1 * | 6/2006 | Xu et al. ..................... | 324/750 |

FOREIGN PATENT DOCUMENTS

JP    2004288980    10/2004

* cited by examiner

*Primary Examiner*—Minh N. Tang
(74) *Attorney, Agent, or Firm*—Volentine & Whitt, PLLC

(57) ABSTRACT

An apparatus and related method for testing a semiconductor device are provided. The apparatus includes a unit depositing charge on an insulating layer formed on a semiconductor substrate, a unit measuring leakage current from the bottom surface of the semiconductor substrate, and a unit measuring surface voltage associated with the insulating layer.

20 Claims, 5 Drawing Sheets

US 7,339,392 B2

APPARATUS MEASURING SUBSTRATE LEAKAGE CURRENT AND SURFACE VOLTAGE AND RELATED METHOD

BACKGROUND OF THE INVENTION

1. Field of the Invention

Embodiments of the invention relate to an apparatus and a method for testing a semiconductor device. More particularly, embodiments of the invention relate to an apparatus and a related method adapted to test for leakage current associated with the substrate of a semiconductor device.

This application claims priority from Korean Patent Application No. 10-2005-0065999 filed on Jul. 20, 2005, the subject matter of which is incorporated herein by reference in its entirety.

2. Description of the Related Art

Increased integration density and improved performance are ever present design goals for contemporary semiconductor devices, and the object of ongoing research and development. Increased integration density translates into reduced component size. For example, the insulating layer commonly formed between a transistor and a capacitor is made as thin as possible. However, the performance of this very thin layer must not be degraded. Thus, in order to improve the performance of semiconductor devices incorporating this type of layer, it is important to reliably form the insulating layer with minimal thickness and without defects. In general, a silicon oxide layer ($SiO_2$) has been used to form a gate insulating layer since a conventionally understood fabrication process, whereby a silicon substrate is oxidized to form the desired silicon oxide layer, is simple and very stable. Yet, silicon oxide has a relatively low dielectric constant of about 3.9. Thus, there are very real limits to the minimal thickness of the gate insulating layer formed from silicon oxide. For example, if a gate insulating layer is formed from silicon oxide having a very small thickness, a tunnel current may flow through the gate insulating layer, thereby increasing leakage current for the constituent semiconductor device.

As a result, emerging semiconductor designs use one or more materials to form a gate insulating layer having a dielectric constant higher than silicon oxide. These materials generally allow the formation of a thinner gate insulating layer which serves as an effective replacement for the thicker, formerly used silicon oxide layer. The insulating effect of such "new" layers may be expressed as an "equivalent oxide thickness" relative to the former silicon oxide layer.

The equivalent oxide thickness for a gate insulating layer of given thickness, as formed from a high dielectric material, is typically measured using a corona discharge process. This conventionally understood process begins by depositing charge in a corona discharge state on a selected portion of a semiconductor substrate which is intended to receive the subject gate insulating layer. Then, surface voltage at selected points on the semiconductor substrate are measured with respect to the deposited charge. Lastly, an equivalent oxide thickness is calculated using the slope of a graph relating the amount of the deposited charge with the measured surface voltage of the semiconductor substrate.

However, this conventional testing process suffers from a lack of accuracy. For example, the leakage current generated in relation to the semiconductor substrate being tested is influenced by the deposited charge. That is, there is a difference between the amount of deposited charge and the actual amount of charge remaining on the semiconductor substrate being tested. Thus, it is difficult to accurately calculate the true equivalent oxide thickness. Further, a large difference may exist between the equivalent oxide thickness for the entire semiconductor substrate and the equivalent oxide thickness as measured at the tested portion of the semiconductor substrate. Thus, reliable data on the equivalent oxide thickness for an insulating layer deposited on a semiconductor substrate cannot be provided. As a result, it is difficult to realize a desired equivalent oxide thickness.

At present, there exists no process adapted for use within a mass-production environment that provides high reproducibility and reliability of test measurements for an insulating layer formed from various dielectric materials, including silicon oxide. At a minimum, a more accurate process for measuring an equivalent oxide thickness is needed.

SUMMARY OF THE INVENTION

Embodiments of the invention provide an apparatus and related method adapted to accurately test a semiconductor substrate relative to an insulating layer and further adapted to yield test results reliably indicating an equivalent oxide thickness for the insulting layer.

Thus, in one embodiment, the invention provides an apparatus for testing a semiconductor device, comprising; a charge depositing unit adapted to deposit charge on a semiconductor substrate having an insulating layer formed thereon, a current measuring unit adapted to measure leakage current from a bottom surface of the semiconductor substrate, and a potential measuring unit adapted to measure surface voltage on the insulating layer. In another embodiment, the invention provides a method of testing a semiconductor device, comprising depositing charge on an insulating layer formed of a semiconductor substrate, measuring leakage current at a bottom surface of the semiconductor substrate, and measuring surface voltage on the insulating layer.

BRIEF DESCRIPTION OF THE DRAWINGS

Several embodiments of the invention will be described with reference to accompanying drawings. Throughout the drawings and the associated written description, like reference numerals refer to like or similar elements. In the drawings.

Figure (FIG.) 1 is a schematic view of an apparatus adapted to test a semiconductor device according to an embodiment of the invention.

DESCRIPTION OF EXEMPLARY EMBODIMENTS

The invention is described hereafter in relation to several embodiments. The invention is, however, not limited to only these embodiments. Rather, the embodiments are provided as teaching examples.

Figure 1:
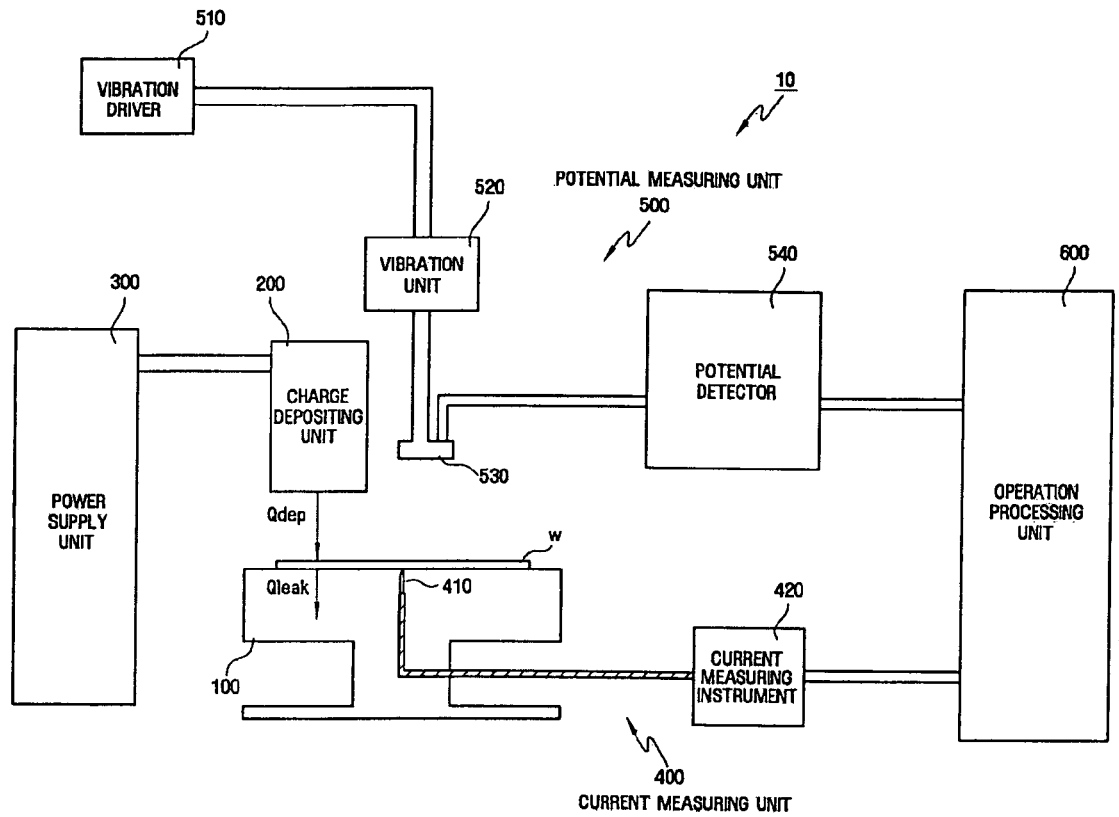

FIG. 1 is a schematic view of an apparatus adapted to test a semiconductor device according to an embodiment of the present invention. Referring to FIG. 1, an apparatus 10 generally comprises a wafer stage 100, a charge depositing unit 200, a power supply unit 300, a current measuring unit 400, a potential measuring unit 500, and an operation processing unit 600.

Wafer stage 100 supports a semiconductor substrate W on which an insulating layer has been formed. Wafer stage 100 may include one open side through which connection is made to current measuring unit 400. Wafer stage 100 securely fixes the semiconductor substrate W using, for example, an electrostatic force.

Charge depositing unit 200 is connected to power supply unit 300. Charge depositing unit 200 is adapted to deposit charge on the semiconductor substrate W. In one embodiment, charge depositing unit 200 uses a corona discharge process using a gas such as $CO_2$ or $H_2O$. As charge is deposited on the semiconductor substrate W, an electric field is formed on the surface of the insulating layer, such that the insulating layer develops a surface voltage ($V_s$). Within this context, power supply unit 300 supplies power to the charge depositing unit 200 having a sufficiently high frequency to generate a corona discharge.

Current measuring unit 400 comprises; a needle 410 adapted to probe the bottom surface of the semiconductor substrate W, and a current measuring instrument 420 connected to needle 410. Current measuring unit 400 may be connected through an opening in wafer stage 100. Current measuring unit 400 is also connected to operation processing unit 600. With this configuration, current measuring unit 400 may measure leakage current apparent at the bottom surface of the semiconductor substrate W.

That is, as needle 410 is positioned to contact the bottom surface of the semiconductor substrate W, current measuring instrument 420 may measure the leakage current. Current measuring instrument 420 then converts the measured leakage current into a leakage charge quantity $Q_{leak}$ by multiplying the leakage current with a measurement time. The diameter of an opening in wafer stage 100 adapted to receive needle 410 may be changed in accordance with size or movement range of needle 410.

Potential measuring unit 500 is adapted to measure the surface voltage ($V_s$) on the insulating layer with respect to a deposition region receiving deposited charge $Q_{dep}$. Potential measuring unit 500 is separated from wafer stage 100 by a predetermined gap and generally comprises in one embodiment a vibration driver 510, a vibration unit 520, a vibration electrode 530, and a potential detector 540.

Vibration driver 510 is connected to vibration unit 520 and vibrates the vibration unit 520 at a predetermined frequency. Vibration electrode 530 is disposed on one end of vibration unit 520. If vibration unit 520 vibrates vertically, a distance between vibration electrode 530 and the insulating layer changes. Thus, an apparent electric field is altered and an alternating current (AC) is generated. As this AC current fluctuates, one voltage potential is determined at which the AC current becomes equal to 0. In this case, potential detector 540 is connected to vibration electrode 530 and detects a potential where a vibration electrode potential ($V_{kp}$) and a surface voltage ($V_s$) of the semiconductor substrate W are identical to each other.

Operation processing unit 600 is connected to current measuring unit 400 and potential measuring unit 500. Operation processing unit 600 performs an operation of subtracting the leakage charge quantity ($Q_{leak}$) measured by current measuring unit 400 from the deposited charge ($Q_{dep}$) deposited by charge depositing unit 200. In addition, the correlation between the deposited charge ($Q_{dep}$) on the semiconductor substrate W measured by potential measuring unit 500 and the surface voltage ($V_s$) of the semiconductor substrate W may be represented graphically. By measuring the slope of the resulting graph, an equivalent oxide thickness may be calculated.

Figure 2:
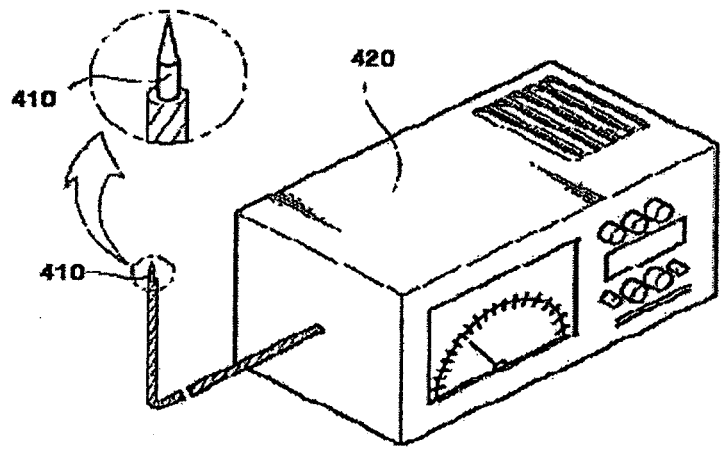
FIG. 2 is a perspective view of a current measuring unit and a needle connected to the current measuring unit illustrated in FIG. 1.

FIG. 2 is a schematic view further illustrating current measuring unit 400 of FIG. 1 which comprises needle 410 and current measuring instrument 420 connected to needle 410. Needle 410 has a tapered shape to increase its probe properties with respect to a natural oxide layer formed on the bottom surface of the semiconductor substrate W. In addition, needle 410 may be formed from metal, such as for example, tungsten (W) or platinum (Pt) composition, to which a small amount of foreign substance may attach. Current measuring instrument 420 measures leakage current and converts the leakage current into a charge quantity by multiplying the leakage current with a measurement time.

A method of testing a semiconductor device according to an embodiment of the invention will now be described with reference to FIGS. 3, 4A, 4B, and 4C.

Figure 3:
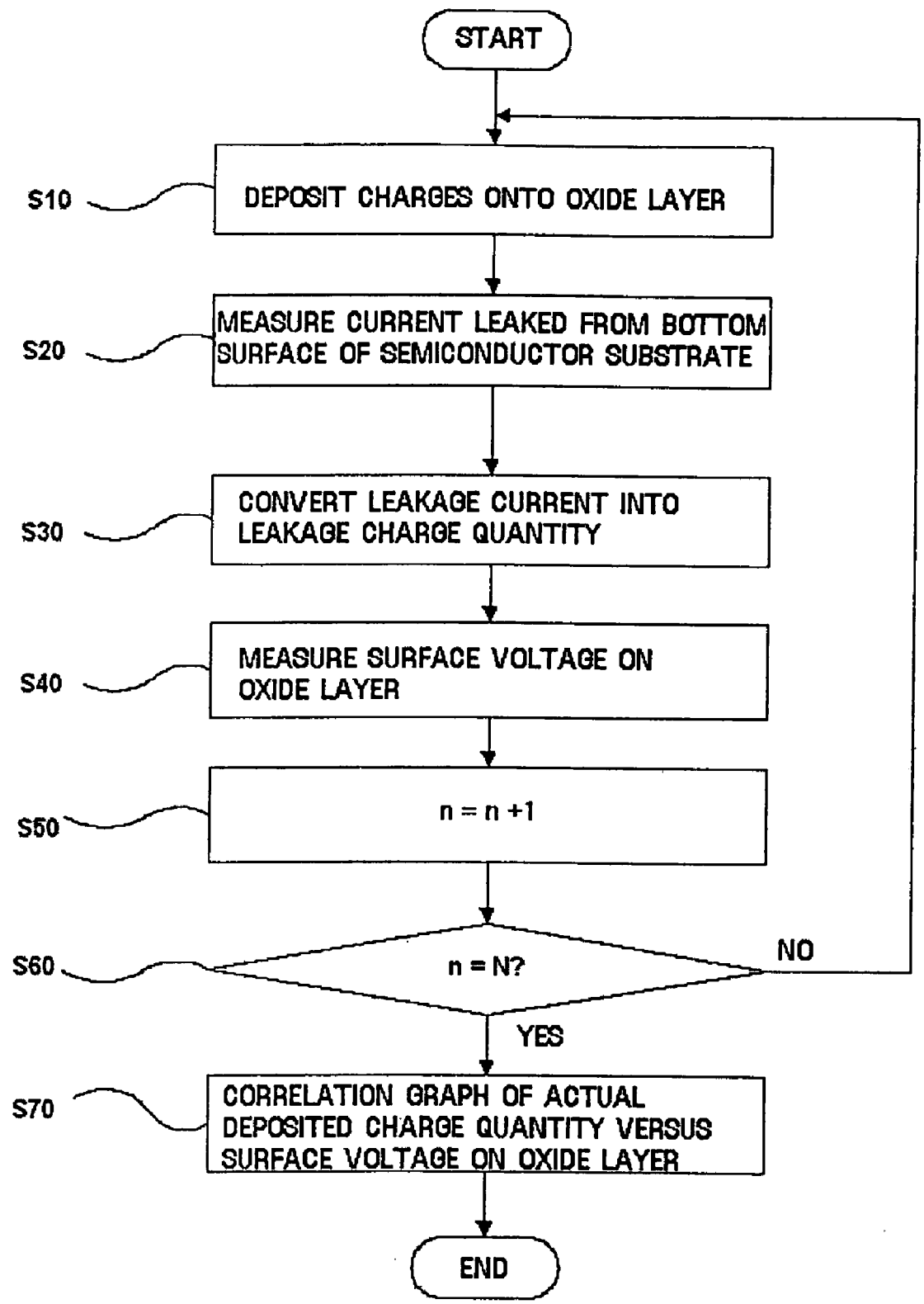
FIG. 3 is a flowchart illustrating a method of testing a semiconductor device according to an embodiment of the invention.
Figure 4A:
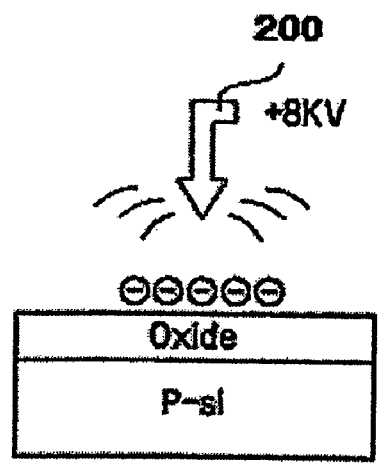
FIG. 4A illustrates a process of depositing charge on a semiconductor substrate to be tested on which an insulating layer is to be formed.
Figure 4B:
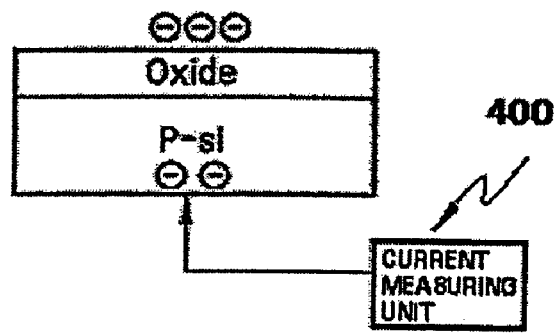
FIG. 4B illustrates an exemplary process for measuring leakage current at a bottom surface of a semiconductor substrate.
Figure 4C:
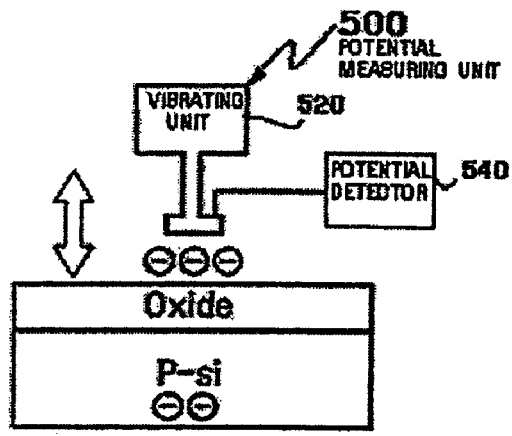
FIG. 4C illustrates an exemplary process for measuring the surface voltage on an insulating layer.

FIG. 3 is a flowchart illustrating the exemplary method of testing a semiconductor device according to an embodiment of the invention. FIG. 4A illustrates a process of depositing charge on a semiconductor substrate to be tested and on which an insulating layer has been formed. FIG. 4B illustrates a process of measuring a current leakage from the bottom surface of the semiconductor substrate, and FIG. 4C illustrates a process of measuring a surface voltage on the insulating layer.

Referring to FIGS. 3 and 4A, charge depositing unit 200 deposits charge on a semiconductor substrate W to be tested, on which an insulating layer is formed, in the form of a corona discharge in operation (S10). If high-frequency power is supplied from power supply unit 300, charge depositing unit 200 deposits a gas, such as $H_2O$ or $CO_2$, in a corona discharge state, such as $H_3O+$ or $CO_3$, on the semiconductor substrate W. The deposited charge ($Q_{dep}$) on the semiconductor substrate W forms an electric field and has a defined potential. Unlike the case of a semiconductor substrate W in which leakage current is not generated, the deposited charge ($Q_{dep}$) does not remain at the surface of the semiconductor substrate W in which leakage current is generated, and some portion of the deposited charge ($Q_{dep}$) will leak from the bottom surface of the semiconductor substrate W. Thus, leakage current flows through the bottom surface of the semiconductor substrate W.

Referring to FIGS. 3 and 4B, the leakage current that flows through the bottom surface of the semiconductor substrate W is next measured (S20). That is, when needle 410 probes the bottom surface of the semiconductor substrate W, current measuring instrument 420 may measure the leakage current.

Next, a leakage charge quantity ($Q_{leak}$) associated with the bottom surface of the semiconductor substrate W may be obtained from the measured leakage current (S30). For example, the leakage charge quantity ($Q_{leak}$) may be determined using the measured leakage current by multiplying it with a measurement time, as shown by Equation 1 below.

$$I = \frac{dQ}{dt}$$

Alternatively, the leakage charge quantity ($Q_{leak}$) may be determined using current measuring instrument 420 by multiplying the measured leakage current with the measurement time.

Referring now to FIGS. 3 and 4C, a surface voltage ($V_s$) associated with the insulating layer with respect to the deposition region of deposited charge is measured (S40). That is, when vibration unit 520 vibrates vertically, a distance between vibration electrode 530 and the insulating layer is continuously changed such that an electric field is altered to generate a corresponding AC signal, (e.g., a current). During this process, one potential is identified wherein the corresponding AC signal is equal to 0. In this case, the surface voltage ($V_s$) associated with the insulating layer may be detected by potential detector 540 using, for example, Equation 2 below, where C is a known capacitance.

$$Q = C(Vs - Vkp)$$
$$I = \frac{dQ}{dt} = C\frac{d}{dt}(Vs - Vkp) + (Vs - Vkp)\frac{dC}{dt} = (Vs - Vkp)\frac{dC}{dt} = 0$$

Since the surface voltage ($V_s$) of the insulating layer and a vibration electrode potential ($V_{kp}$) are not functions that vary with time, their partial derivatives with respect to time are equal to 0.

As such, as a potential where the corresponding AC signal is equal to 0, the vibration electrode potential ($V_{kp}$) and the surface voltage ($V_s$) of the insulating layer will be identical to each other, and the surface voltage ($V_s$) of the insulating layer can be detected.

The foregoing exemplary method steps are repeated for some predetermined number (N) of cycles (S60), by, for example, incrementing an operations counter (S50). Once the predetermined number of cycles is complete, a corresponding graph of the obtained data is drawn (S70).

First, the leakage charge quantity $Q_{leak}$ is subtracted from the deposited charge $Q_{dep}$ using the operation processing unit 600 so that charges that exist on the insulating layer can be calculated.

In addition, the correlation between charges ($Q_{dep}$-$Q_{leak}$) on the insulating layer calculated using operation processing unit 600 may be represented in the graph. Then, an equivalent oxide thickness may be calculated using the slope of the graph.

The correlation between deposited charge ($Q_{dep}$) on the semiconductor substrate W on which an insulating layer is formed and the surface voltage ($V_s$) on the insulating layer in the region in which deposited charge ($Q_{dep}$) are deposited will now be described with reference to FIGS. 5 and 6.

Figure 5:
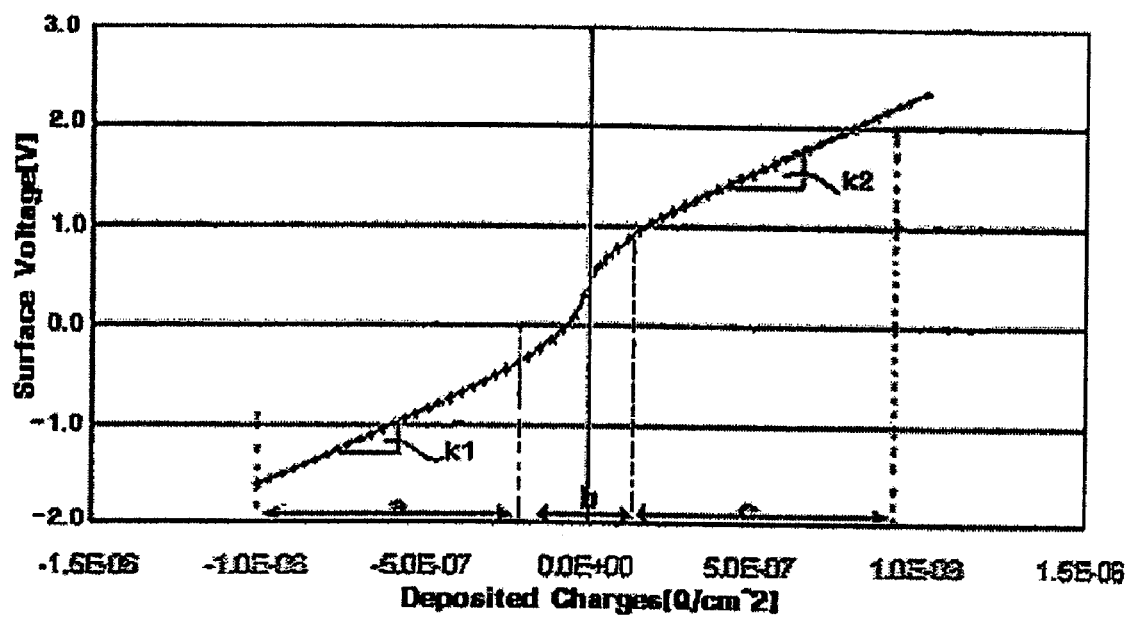
FIG. 5 is a graph illustrating surface voltage versus deposited charge when leakage current is not generated in a semiconductor substrate.
Figure 6:
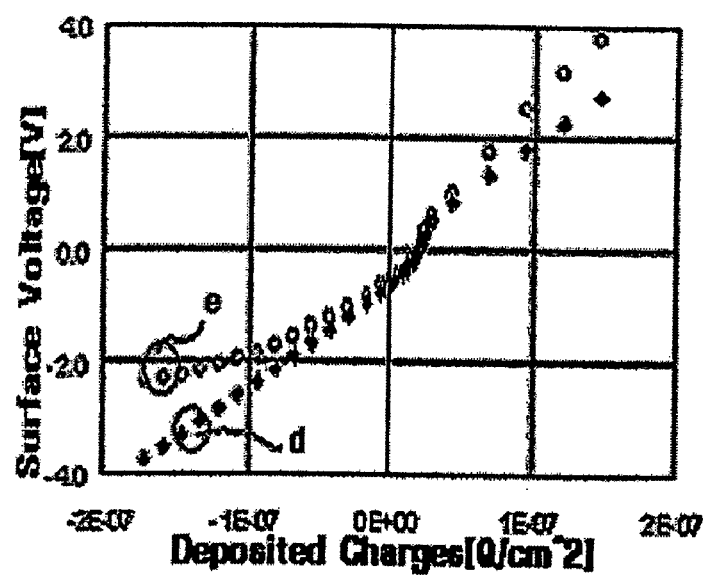
FIG. 6 is a plot comparing the graphs of surface voltage versus deposited charge for an ideal semiconductor substrate and a semiconductor substrate in which a leakage current is generated in an accumulation region.

FIG. 5 is a graph of surface voltage versus deposited charge when current leakage is not generated in relation to the semiconductor substrate being tested. FIG. 6 is a plot comparing the graphs of surface voltage versus deposited charge of an ideal semiconductor substrate and a semiconductor substrate in which a leakage current is generated in an accumulation region.

Referring to FIG. 5, the X-axis indicates deposited charge ($Q_{dep}$), and the Y-axis indicates surface voltage ($V_s$) for the insulating layer. The equivalent oxide thickness may be calculated using the slope of the plot defined by deposited charge ($Q_{dep}$) and surface voltage ($V_s$) using Equation 3 below.

$$T_{ox} = \varepsilon_{ox}\left(\frac{dV_{ox}}{dQ_{dep}}\right)$$

where $\varepsilon_{ox}$ is a dielectric constant of an oxide layer, and $T_{ox}$ is the thickness of the oxide layer.

Referring to FIG. 5, a region "a" is defined as an accumulation region in which more charge having the same polarity as impurities used to dope the semiconductor substrate W are accumulated. Another region "b" is defined as a depletion region in which the number of charges having the opposite polarity as the impurities doping the semiconductor substrate W are accumulated. Yet another region "c" is defined as an inversion region in which the number of charges having the opposite polarity is larger than the number of charges having the same polarity.

Referring to FIG. 5, in the case of an assumed ideal semiconductor substrate W in which no leakage current is generated, a first slope "k1" for accumulation region "a" and a second slope "k2" for inversion region "c" are identical to each other. This means that, when the equivalent oxide thickness is calculated, even when the slope in any region is obtained, the equivalent oxide thickness having the same value can be calculated.

The semiconductor substrate W to be tested in which a leakage current is generated will now be described in detail with reference to FIG. 6.

The graph of the surface voltage ($V_s$) versus the deposited charge ($Q_{dep}$) of the ideal semiconductor substrate W in which leakage current is not generated is indicated by plot "d." The graph of the surface voltage ($V_s$) versus the deposited charge ($Q_{dep}$) of the semiconductor substrate W in which a leakage current is generated is indicated by plot "e." The slope of the plot "e" is smaller than the slope of the plot "d."

In addition, a predetermined slope cannot be obtained for the plot "e." In case of the semiconductor substrate W in which a leakage current is generated, charge loss is generated by the leakage charge quantity ($Q_{leak}$). Thus, there is a difference between the charge ($Q_{dep}$) deposited by charge depositing unit 200 and the actual charge that exists on the insulating layer. Thus, the surface voltage ($V_s$) on the insulating layer is decreased in accordance with the leakage charge quantity ($Q_{leak}$). Accordingly, the slope of the graph of the surface voltage $V_s$ versus the deposited charge ($Q_{dep}$) is changed.

Figure 7:
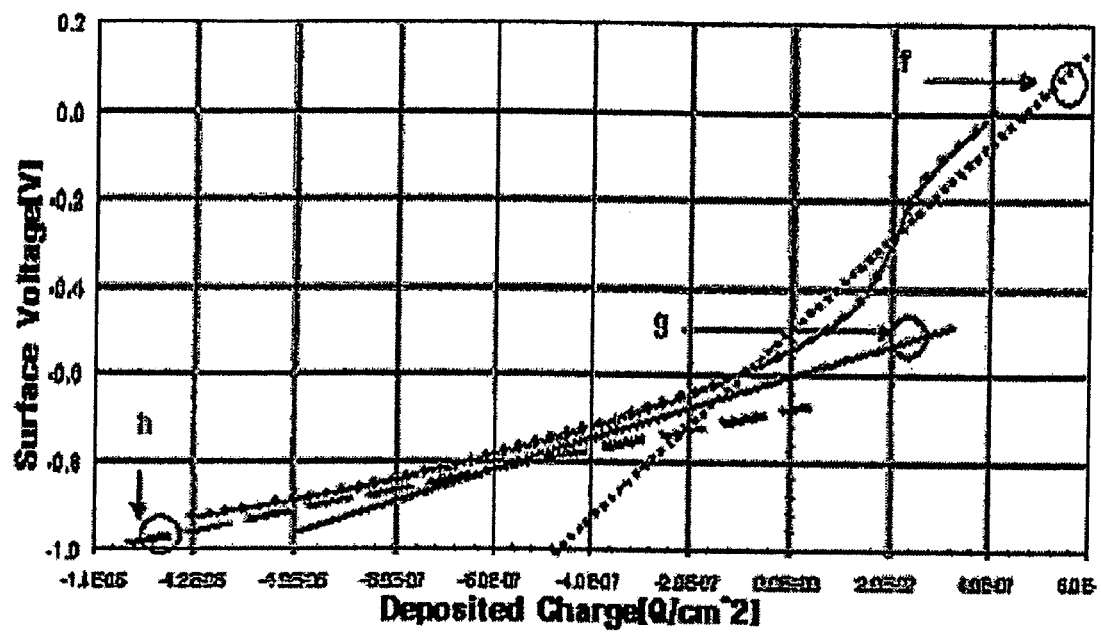
FIG. 7 is a graph showing slope changes in each region of the graph of surface voltage versus deposited charge of a semiconductor substrate in which a leakage current is generated.

FIG. 7 illustrates an example of obtaining the slope of the graph of a semiconductor W in which a leakage current is generated. Referring to FIG. 7, the equivalent oxide thickness is calculated using the graph of the surface voltage ($V_s$) versus the deposited charge ($Q_{dep}$).

Charge loss is generated in the deposited charge ($Q_{leak}$) by the leakage charge quantity ($Q_{leak}$) so that a predetermined slope cannot be obtained. In this case, different slopes are obtained depending on whether a point for obtaining each slope is set.

In FIG. 7, plot "f" indicates a slope measured in the inversion region, plot "g" indicates a slope measured in the accumulation region near the depletion region, and plot "h" indicates a slope measured in an initial accumulation region.

Thus, in case of the semiconductor substrate W in which a leakage current is generated, charge loss is generated by a leakage charge quantity so that the graph having a predetermined slope cannot be obtained. Thus, the equivalent oxide thickness is calculated in relation to a corresponding measurement point.

However, according to an embodiment of the invention, the amount of leakage charge may be known and compensated for such that a resulting graph can be obtained using the actual amount of charge that exists on the insulating layer. Thus, a predetermined equivalent oxide thickness may be calculated even when the slope is measured at any point along a graph plot. In addition, if an amount of the leakage charge is additionally deposited, a semiconductor device having a desired equivalent oxide thickness can nonetheless be fabricated.

Figure 8:
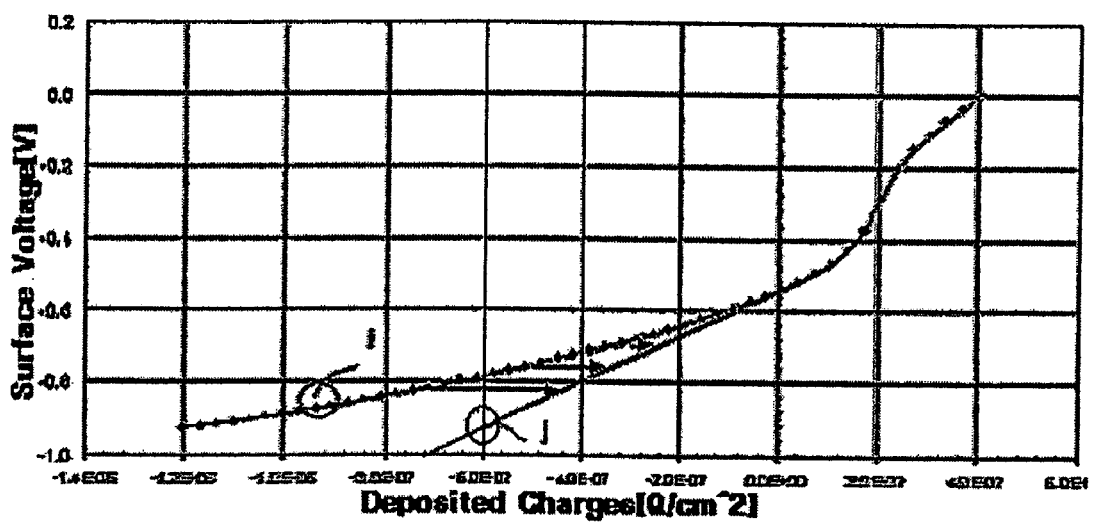
FIG. 8 is a plot comparing the graphs of surface voltage versus deposited charge for a semiconductor substrate in which a leakage current is generated before and after compensating for leakage current.

FIG. 8 illustrates a graph in which plot "i" indicates surface voltage ($V_s$) versus deposited charge of the semiconductor substrate W in which a leakage current is generated, and plot "j" indicates similar results obtained after compensating for the leakage current. In case of plot "i," the X-axis indicates deposited charge ($Q_{dep}$) and the Y-axis represents a surface voltage ($V_s$) on the insulating layer on which the deposited charge ($Q_{dep}$) is deposited, and charge that exist on the actual insulating layer is charge corresponding to a charge loss generated in the deposited charge ($Q_{dep}$) by leakage charge quantity ($Q_{leak}$).

Plot "j" is obtained by compensating for the leakage current attributed to the leakage charge quantity ($Q_{leak}$) lost from the deposited charge ($Q_{dep}$). That is, in case of graph "j," the X-axis indicates a value obtained by subtracting the leakage charge quantity ($Q_{leak}$) from the deposited charge ($Q_{dep}$), and the Y-axis indicates a surface voltage ($V_s$) on the insulating layer on which the deposited charge ($Q_{dep}$) is deposited. Thus, by using the apparatus and method for testing a semiconductor device according to the present invention, a compensated graph of charge actually existing on the insulating layer and the resulting surface voltage ($V_s$) on the insulating layer measured in the deposition region may be obtained.

Since the calculated slope is uniform even when measured for any region of the resulting graph, a predetermined equivalent oxide thickness may accurately be obtained.

As described above, the apparatus and related method for testing a semiconductor device according to the illustrated embodiment of the invention provides at least the following advantages:

First, the amount of charge leaking from the bottom surface of the semiconductor substrate may be measured.

Second, the amount of leakage charge is compensated such that the graph can be obtained using the actual amount of charge that exists on the substrate and a correlation graph having a uniform slope is obtained.

Third, since a correlation graph having a uniform slope is obtained, a predetermined equivalent oxide thickness may be readily obtained with high reliability.

Fourth, a desired equivalent oxide thickness may be obtained by additionally depositing an amount of the leaked charge on the semiconductor substrate to be tested, thereby ensuring reproducibility.

Fifth, the equipment used in the foregoing manner offers reliability and reproducibility of operations with enhanced efficiency.

While the present invention has been described with reference to exemplary embodiments thereof, it will be understood by those skilled in the art that various changes in form and details may be made therein without departing from the scope of the invention as defined by the following claims and equivalents thereof.

What is claimed is:

1. An apparatus for testing a semiconductor device, comprising:
   a charge depositing unit adapted to deposit charge on a semiconductor substrate having an insulating layer formed thereon;
   a current measuring unit adapted to measure leakage current from a bottom surface of the semiconductor substrate;
   a potential measuring unit adapted to measure surface voltage on the insulating layer; and,
   an operation processing unit adapted to subtract a leakage charge quantity derived by the current measuring unit from a charge quantity deposited on the insulating layer.

2. The apparatus of claim 1, wherein the charge depositing unit is further adapted to deposit charge on the semiconductor substrate using a corona discharge.

3. The apparatus of claim 1, wherein the current measuring unit comprises:
   a needle adapted to probe the bottom surface of the semiconductor substrate; and,
   a current measuring instrument connected to the needle.

4. The apparatus of claim 3, wherein the needle is formed from a tungsten (W) or a platinum (Pt) composition.

5. The apparatus of claim 3, wherein the needle has a tapered shape.

6. The apparatus of claim 3, wherein the current measuring unit is further adapted to convert the leakage current into the leakage charge quantity by multiplying the leakage current by a measurement time.

7. The apparatus of claim 1, wherein the potential measuring unit comprises a vibration electrode and a potential detector.

8. The apparatus of claim 7, wherein the vibration electrode changes an electric field between the vibration electrode and the insulating layer by vibration and thereby converts the electric field into an alternating current (AC) signal.

9. The apparatus of claim 8, wherein the potential detector is adapted to detect the surface voltage on the insulating layer as a potential where the AC signal is equal to 0.

10. A method of testing a semiconductor device, comprising:
    depositing charge on an insulating layer formed of a semiconductor substrate;
    measuring leakage current at a bottom surface of the semiconductor substrate;
    measuring surface voltage on the insulating layer; and,
    subtracting a leakage charge quantity from a charge quantity deposited on the insulating layer.

11. The method of claim 10, wherein the depositing of charge comprises performing a corona discharge process.

12. The method of claim 10, wherein the measuring the leakage current comprises:
   probing the bottom surface of the semiconductor substrate using a needle and measuring the leakage current using a current measuring instrument.

13. The method of claim 12, further comprising:
   converting the leakage current into the leakage charge quantity by multiplying the leakage current by a measurement time.

14. The method of claim 10, wherein the measuring of the surface voltage on the insulating layer comprises:
   changing an electric field formed between a vibration electrode and the insulating layer and converting the electric field into an alternating current (AC) signal.

15. The method of claim 14, wherein measuring the surface voltage on the insulating layer further comprises:
   detecting the surface voltage on the insulating layer as a potential where the AC signal is equal to 0 using a potential detector.

16. An apparatus for testing a semiconductor device, comprising:
   a charge depositing unit adapted to deposit charge on a semiconductor substrate having an insulating layer formed thereon;
   a current measuring unit adapted to measure leakage current from a bottom surface of the semiconductor substrate and further adapted to convert the leakage current into a leakage charge quantity by multiplying the leakage current by a measurement time; and
   a potential measuring unit adapted to measure surface voltage on the insulating layer.

17. The apparatus of claim 16, wherein the current measuring unit comprises:
   a needle adapted to probe the bottom surface of the semiconductor substrate; and,
   a current measuring instrument connected to the needle.

18. The apparatus of claim 16, wherein the potential measuring unit comprises a vibration electrode and a potential detector.

19. The apparatus of claim 18, wherein the vibration electrode changes an electric field between the vibration electrode and the insulating layer by vibration and thereby converts the electric field into an alternating current (AC) signal.

20. The apparatus of claim 19, wherein the potential detector is adapted to detect surface voltage on the insulating layer as a potential where the AC signal is equal to 0.

* * * * *